(12) United States Patent
Nagashima et al.

(10) Patent No.: US 12,106,029 B2
(45) Date of Patent: Oct. 1, 2024

(54) HIGH-LEVEL SYNTHESIS DEVICE AND HIGH-LEVEL SYNTHESIS METHOD

(71) Applicant: Hitachi, Ltd., Tokyo (JP)

(72) Inventors: Tomoharu Nagashima, Tokyo (JP); Kazuki Ikeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 531 days.

(21) Appl. No.: 17/621,010

(22) PCT Filed: May 7, 2020

(86) PCT No.: PCT/JP2020/018589
§ 371 (c)(1),
(2) Date: Dec. 20, 2021

(87) PCT Pub. No.: WO2020/255576
PCT Pub. Date: Dec. 24, 2020

(65) Prior Publication Data
US 2022/0366111 A1  Nov. 17, 2022

(30) Foreign Application Priority Data

Jun. 21, 2019  (JP) ................................ 2019-115205

(51) Int. Cl.
*G06F 30/327*  (2020.01)
(52) U.S. Cl.
CPC .................... *G06F 30/327* (2020.01)
(58) Field of Classification Search
CPC ................................................ G06F 30/327
USPC ....................................................... 716/104
See application file for complete search history.

(56) References Cited

U.S. PATENT DOCUMENTS

| | | | | |
|---|---|---|---|---|
| 10,162,324 | B2 * | 12/2018 | Kellers | ...................... G06F 8/30 |
| 10,809,933 | B2 * | 10/2020 | Redfern | ................ G06F 3/0647 |
| 11,762,762 | B1 * | 9/2023 | Yu | .............................. G06F 8/40 |
| | | | | 717/169 |
| 2016/0275213 | A1 * | 9/2016 | Tomita | ................... G06F 30/327 |
| 2019/0114499 | A1 * | 4/2019 | Delaye | ................... G06V 10/95 |

(Continued)

FOREIGN PATENT DOCUMENTS

| WO | 2017/154183 A1 | 9/2017 | |
|---|---|---|---|
| WO | WO-2020255576 A1 * | 12/2020 | ........... G06F 30/327 |
| WO | WO-2024091969 A1 * | 5/2024 | ............. H04N 19/31 |

*Primary Examiner* — Suresh Memula
(74) *Attorney, Agent, or Firm* — Volpe Koenig

(57) ABSTRACT

This high-level synthesis device, which has a processor and a memory, and generates a hardware description code that describes the configuration of an integrated circuit connected to an external memory, comprises a high-level synthesis code adjustment unit which receives a high-level synthesis code that describes a process to be executed by the integrated circuit and an external memory access variable for exchanging data with the external memory, analyzes the high-level synthesis code, and reconstructs the high-level synthesis code on the basis of the analysis result, wherein the high-level synthesis code adjustment unit includes: a burst access determination unit that analyzes the external memory access variable in the high-level synthesis code, and determines whether burst access to the external memory is possible; and a code reconstructing unit that adds a code for executing burst access to the high-level synthesis code, for the external memory access variable capable of being burst accessed.

12 Claims, 17 Drawing Sheets

(56) References Cited

U.S. PATENT DOCUMENTS

2019/0179795 A1* 6/2019 Huang ................... G06N 20/00
2019/0303513 A1 10/2019 Yamamoto

* cited by examiner

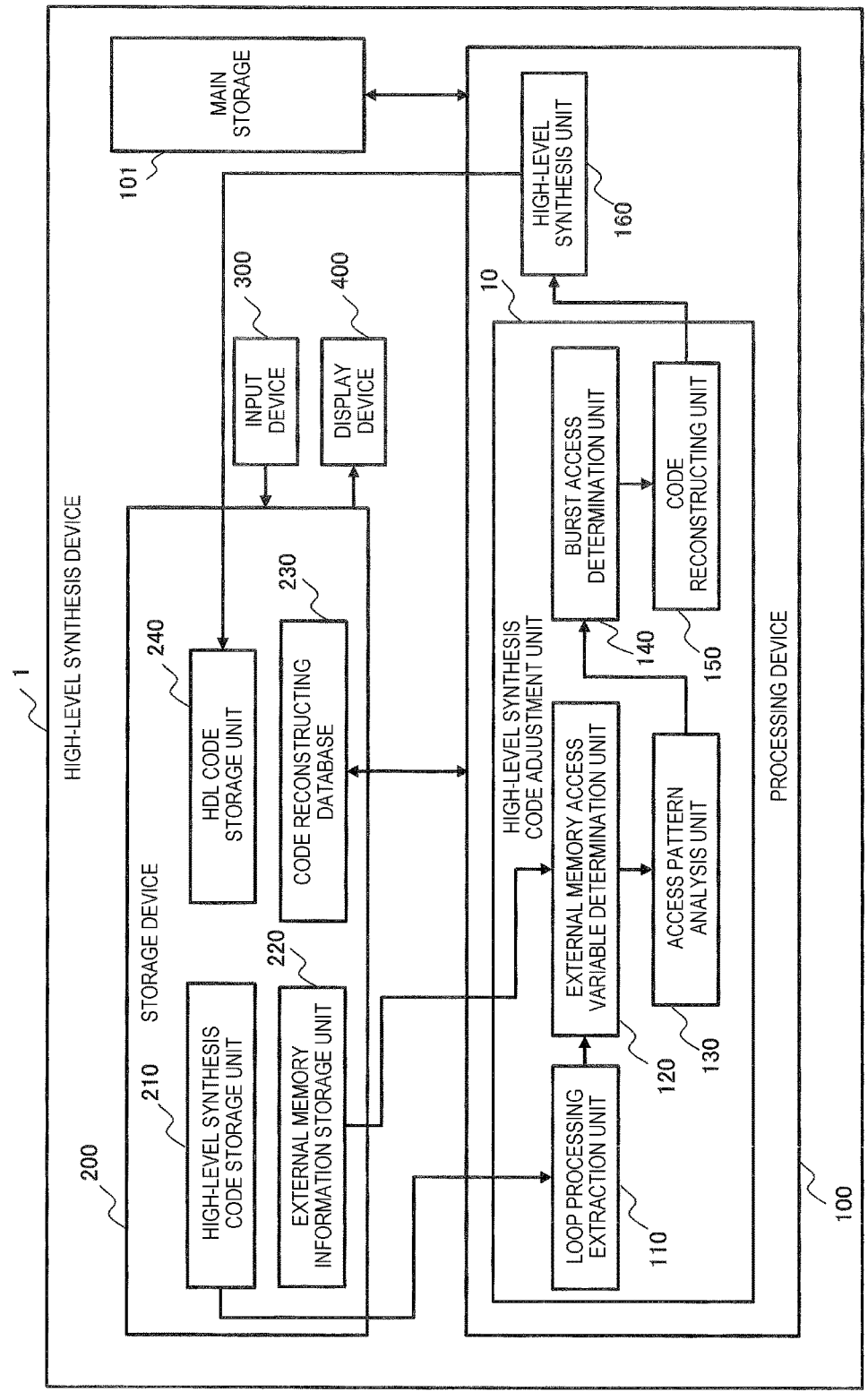
[FIG. 1]

[FIG. 2]
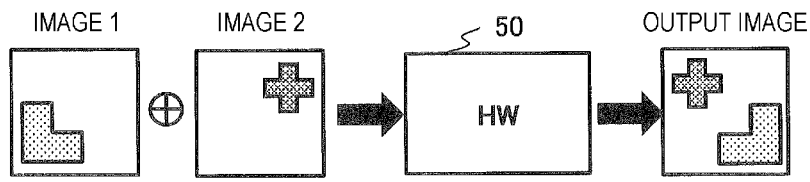
[FIG. 3]
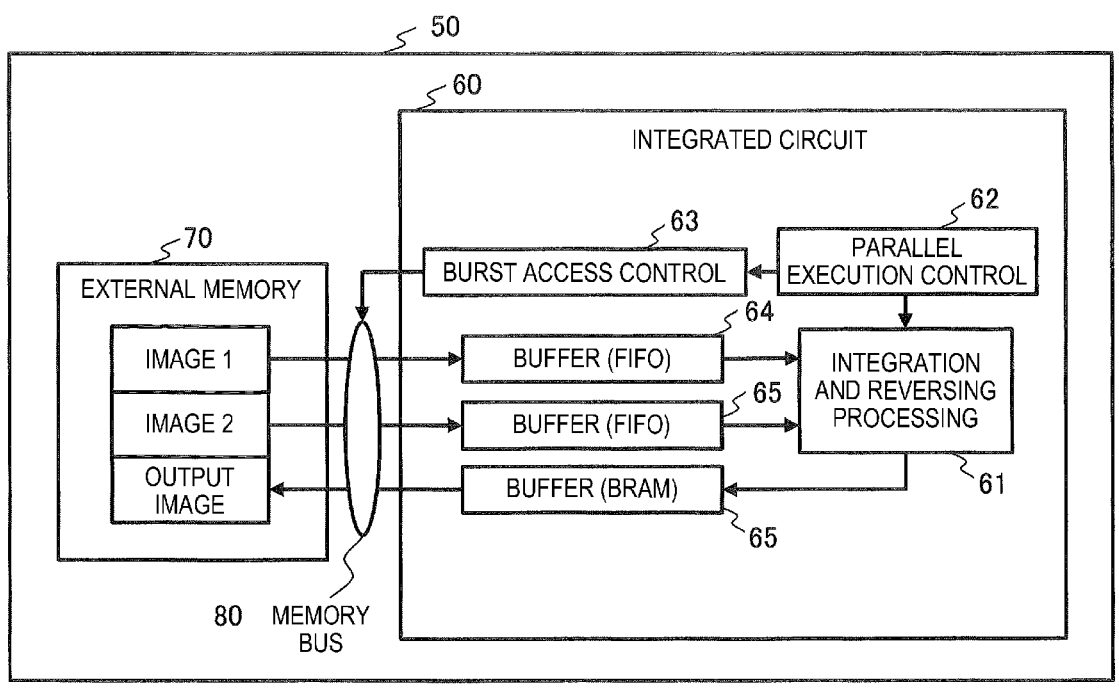
[FIG. 4]
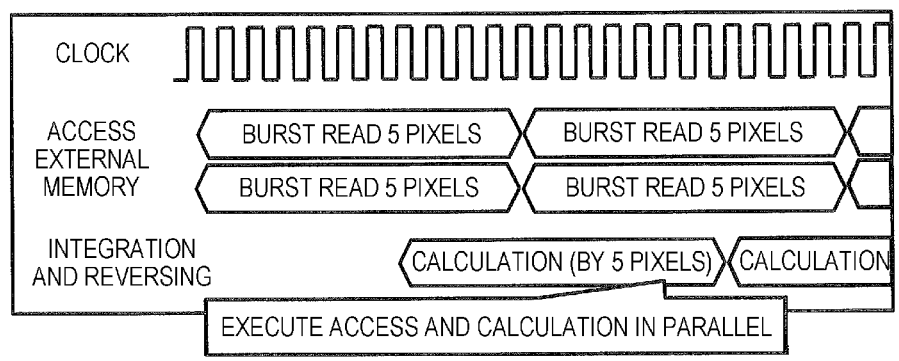

[FIG. 5]
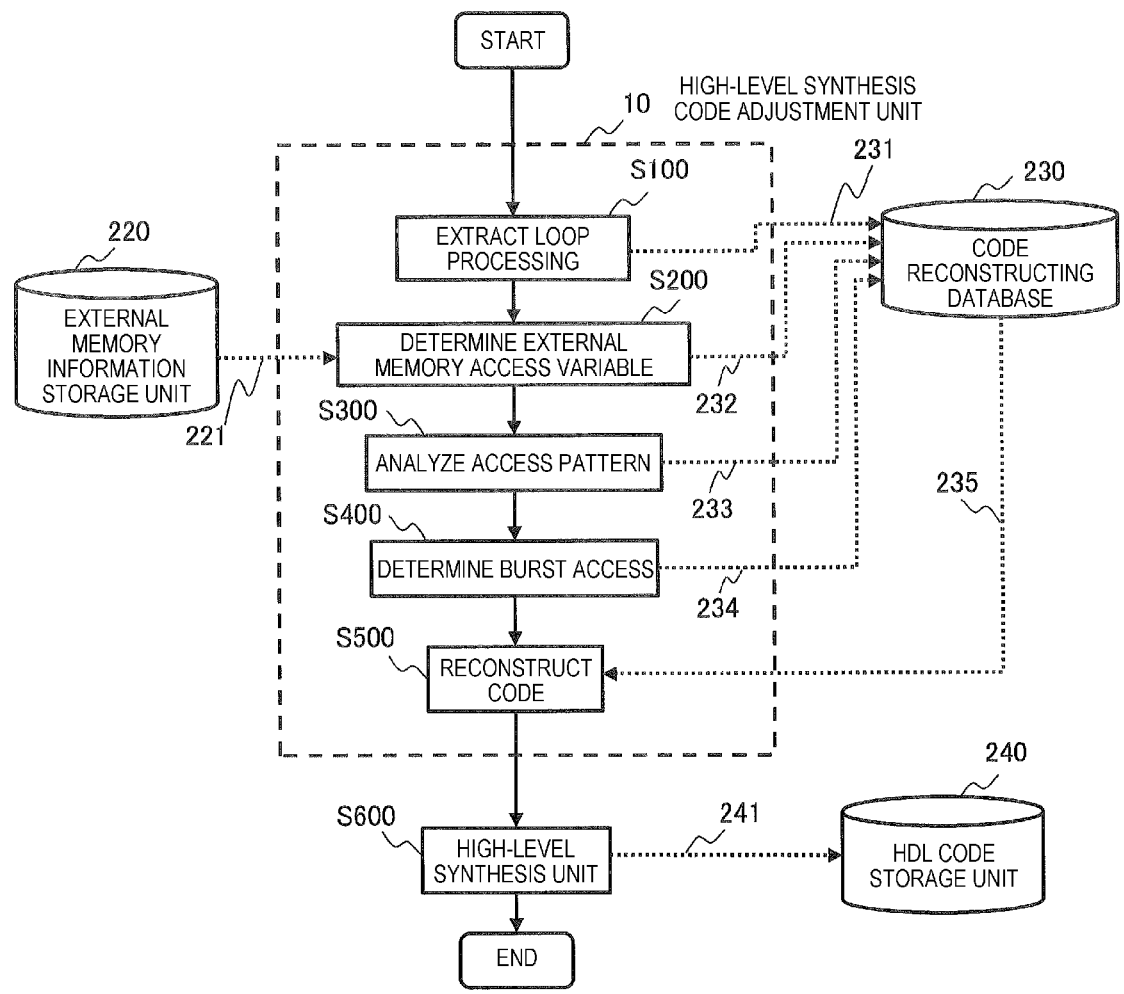

[FIG. 6]
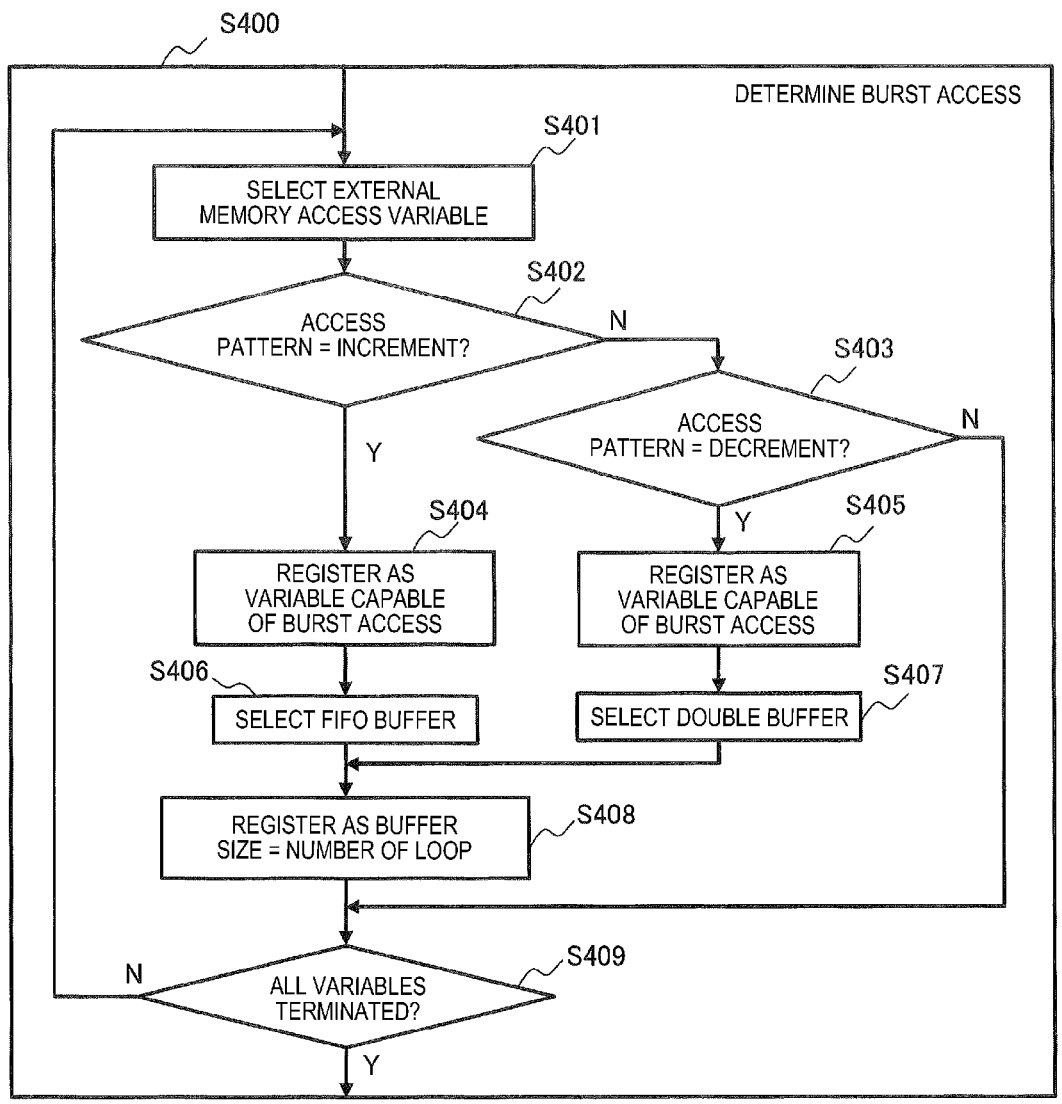

[FIG. 7]
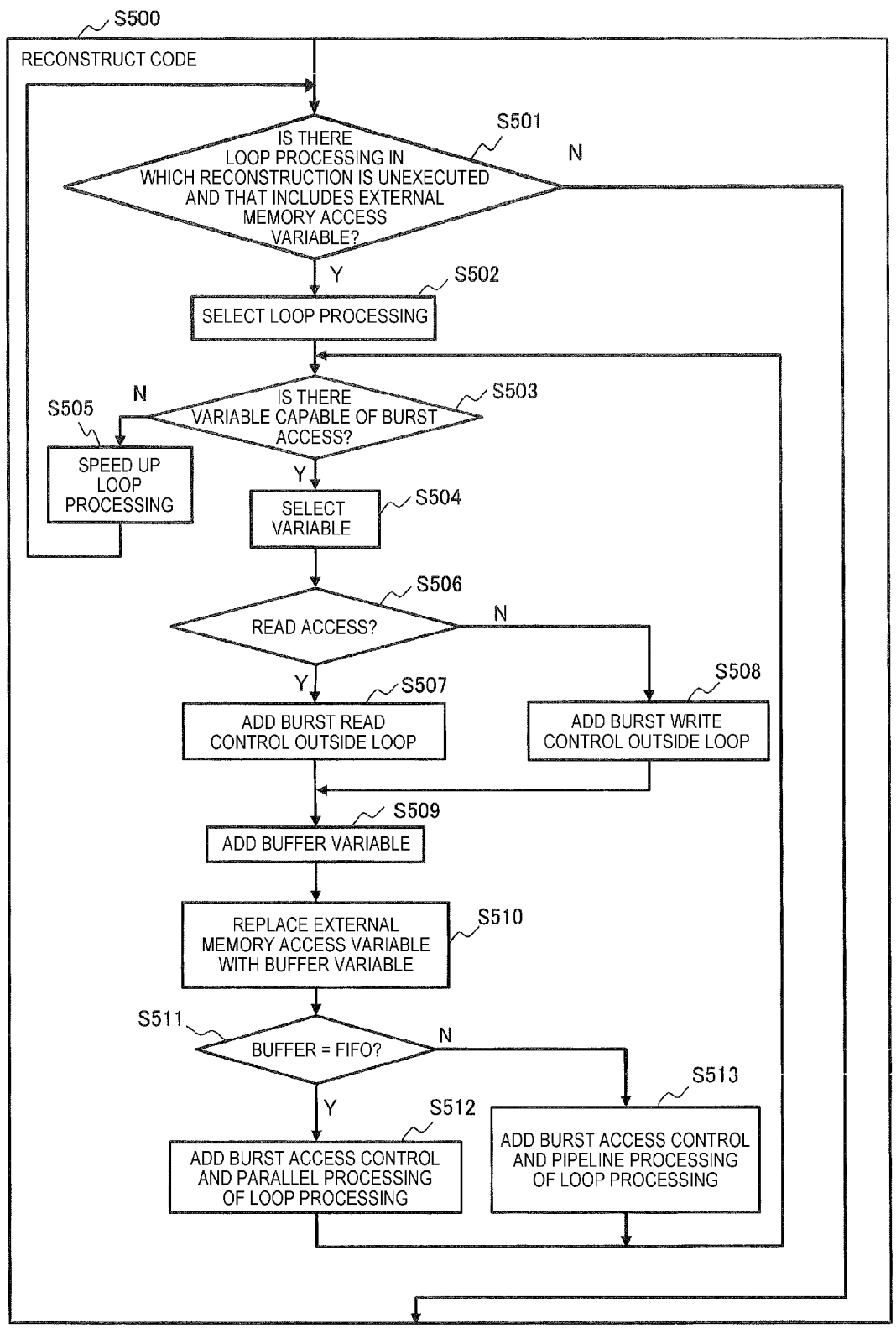

[FIG. 8]

```
                                                              ~211
┌─────────────────────────────────────────────────────────────────┐
│ #define HEIGHT 512                                              │
│ #define WIDTH 512                                               │
│                                                                 │
│ typedef unsigned char u8;                                       │
│                                                                 │
│ void func(u8 *img1, u8 *img2, u8 *out)                          │
│ {                                                               │
│   int i, j;                            ~500                     │
│...................................................~501.........│
│ :LOOP1: for(i=0; i<HEIGHT; i++){                              : │
│ : :LOOP11: for(j=0; j<WIDTH; j++){                           :: │
│ : :        out[i*WIDTH+(WIDTH-1)-j] = (img1[i*WIDTH+j]>>1)   :: │
│ : :                                 + (img2[i*WIDTH+j]>>1);  :: │
│ : :}                                                         :: │
│ :}                                                            : │
│.................................................................│
│                                                                 │
│   return;                                                       │
│ }                                                               │
└─────────────────────────────────────────────────────────────────┘
```

[FIG. 9]

235 CODE RECONSTRUCTING INFORMATION

| 2351 | 2352 | 2353 | 2354 | 2355 | 2356 | 2357 | 2358 | 2359 |
|---|---|---|---|---|---|---|---|---|
| LOOP # | LOOP NAME | VARIABLE # | EXTERNAL MEMORY ACCESS VARIABLE | ACCESS METHOD/ ACCESS PATTERN | BURST ACCESS | BUFFER | BUFFER NAME | BUFFER SIZE |
| 1 | L1 | - | - | - | - | - | - | - |
| 2 | L11 | 1 | out | WRITE/DECREMENT | OK | DOUBLE | buf_out | 512 |
|  |  | 2 | img1 | READ/INCREMENT | OK | FIFO | buf_img1 | 512 |
|  |  | 3 | img2 | READ/INCREMENT | OK | FIFO | buf_img2 | 512 |

[FIG. 10A]

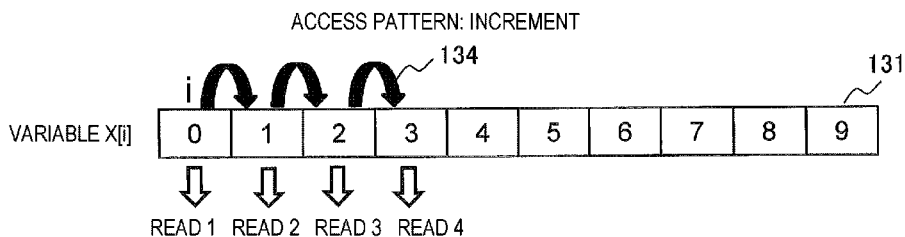

[FIG. 10B]
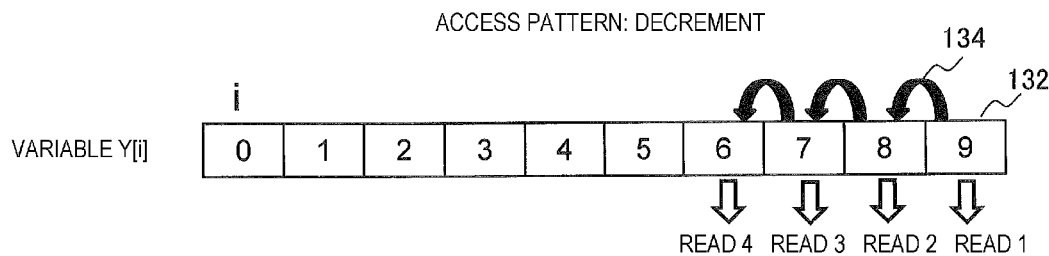
[FIG. 10C]
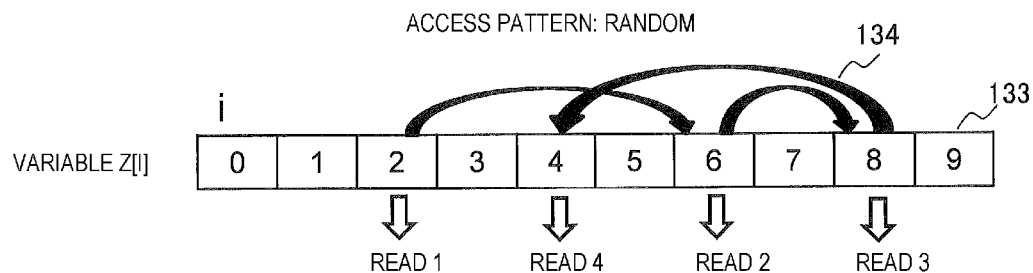

[FIG. 11]

```
#define HEIGHT 512
define WIDTH 512 typedef unsigned char u8;

void func(u8 *img1, u8 *img2, u8 *out)
{
  int i, j;

#pragma ...
  u8 buf_out[512];
  #pragma ...
  u8 buf_img1[512];
  #pragma ...
  u8 buf_img2[512];

LOOP1: for(i=0; i<HEIGHT; i++){
  #pragma ...

Burst_read(img1, buf_img1, i);
    Burst_read(img2, buf_img2, i);

LOOP11: for(j=0; j<WIDTH; j++){
    #pragma ...
            buf_out[(WIDTH-1)-j] = (buf_img1[j]>>1)
                                  + (buf_img2[j]>>1);
    }

Burst_write(out, buf_out, i);
  } return;
}
```

[FIG. 12]
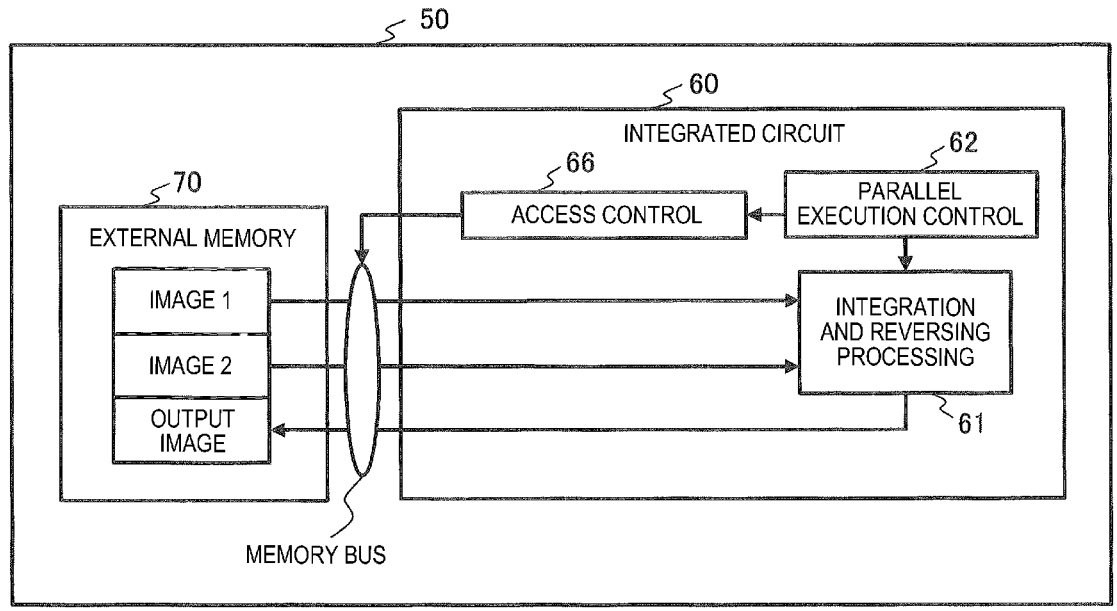
[FIG. 13]
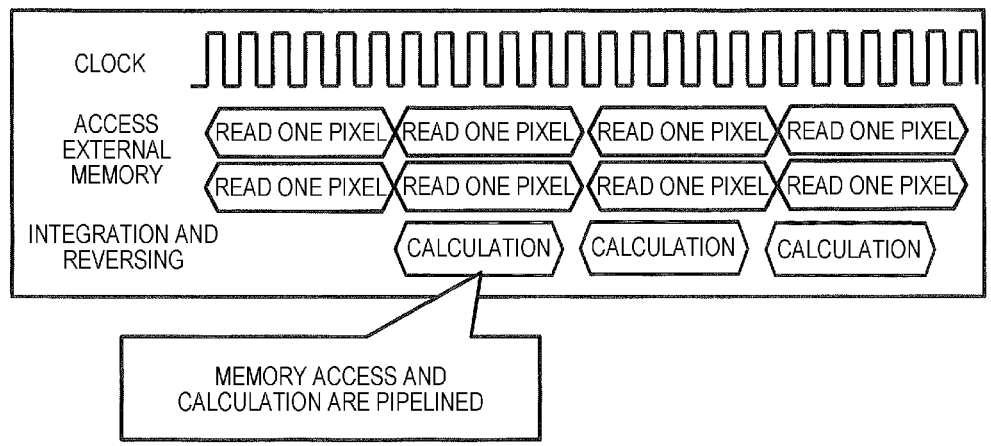

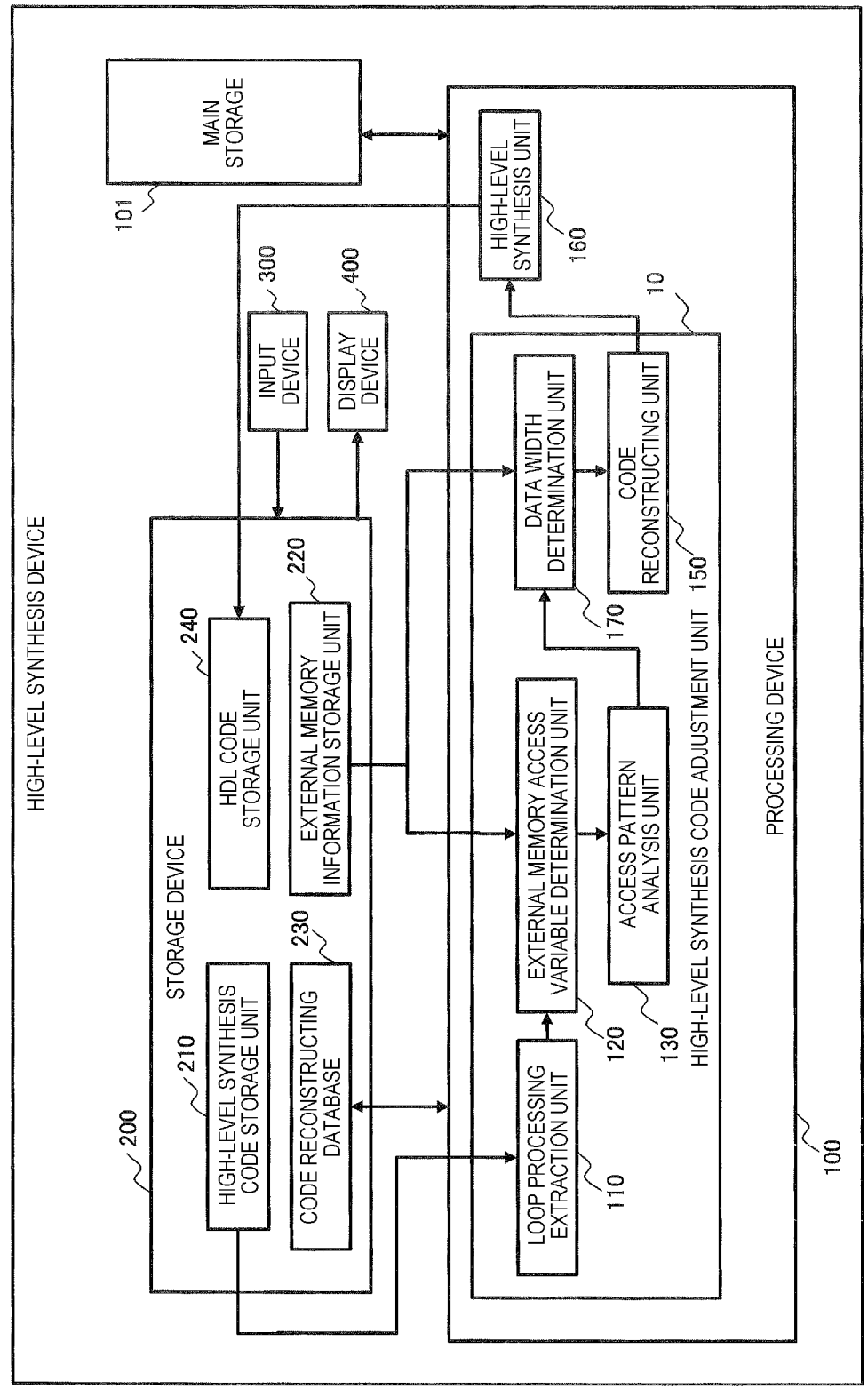
[FIG. 14]

[FIG. 15]
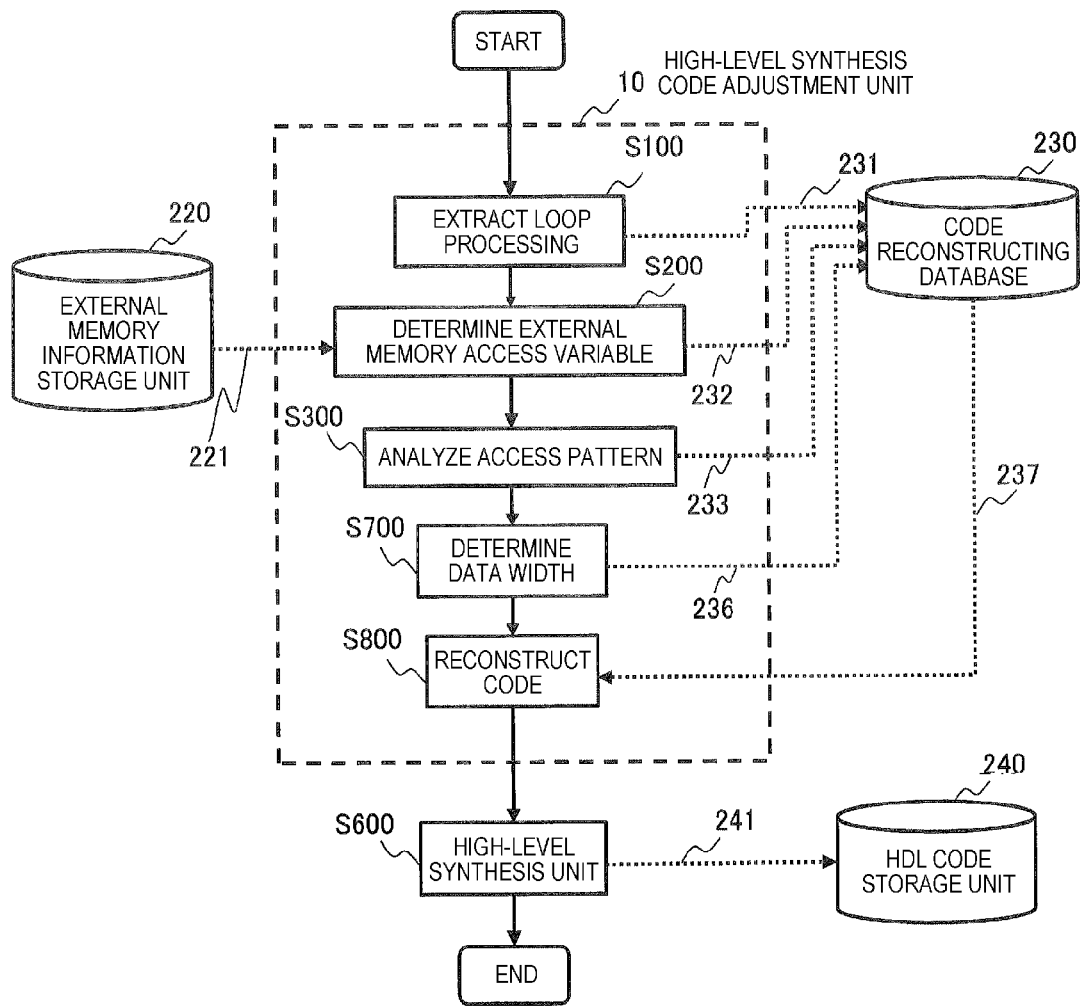

[FIG. 16]
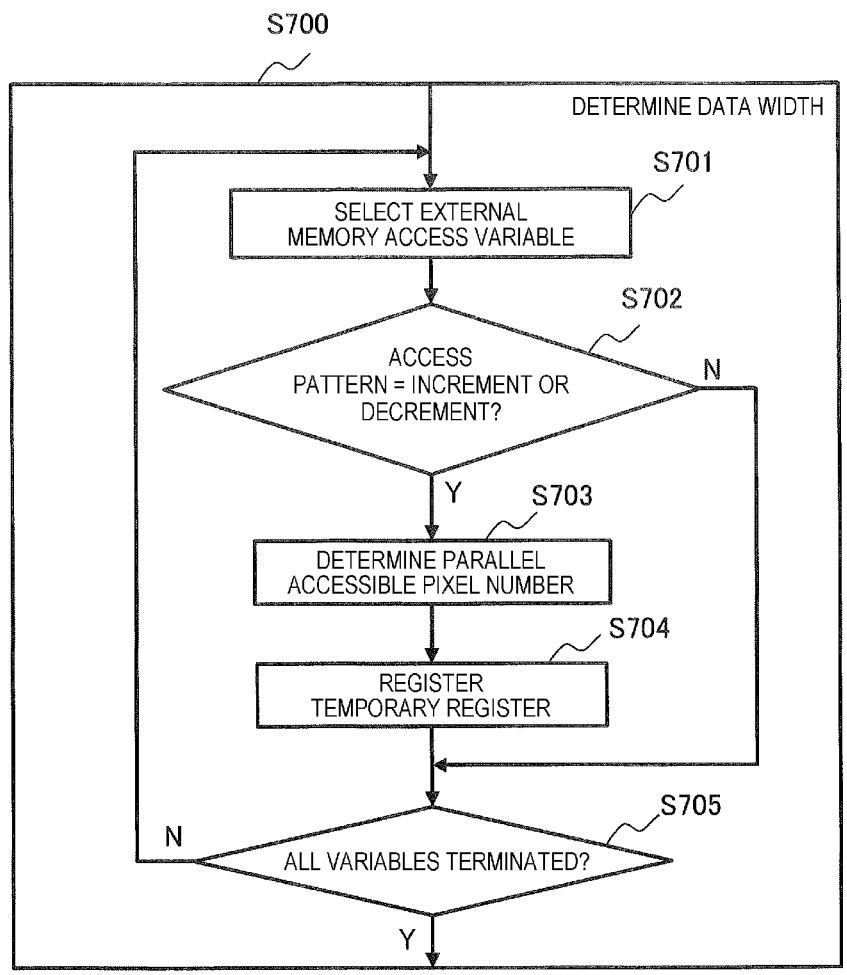

[FIG. 17]

235 CODE RECONSTRUCTING INFORMATION

| LOOP # 2351 | LOOP NAME 2352 | VARIABLE # 2353 | EXTERNAL MEMORY ACCESS VARIABLE 2354 | DATA TYPE 2355 | ACCESS METHOD/ ACCESS PARTTEN 2356 | PARALLEL ACCESSIBLE PIXEL NUMBER 2360 | TEMPORARY REGISTER NAME 2361 |
|---|---|---|---|---|---|---|---|
| 1 | L1 | – | – | – | – | – | – |
| 2 | L11 | 1 | out | Unsigned char (8bit) | WRITE/DECREMENT | 2 | out_t |
|  |  | 2 | img1 | Unsigned char (8bit) | READ/INCREMENT | 2 | img1_t |
|  |  | 3 | img2 | Unsigned char (8bit) | READ/INCREMENT | 2 | img2_t |

WHEN EXTERNAL MEMORY DATA WIDTH = 16 bit

[FIG. 18]
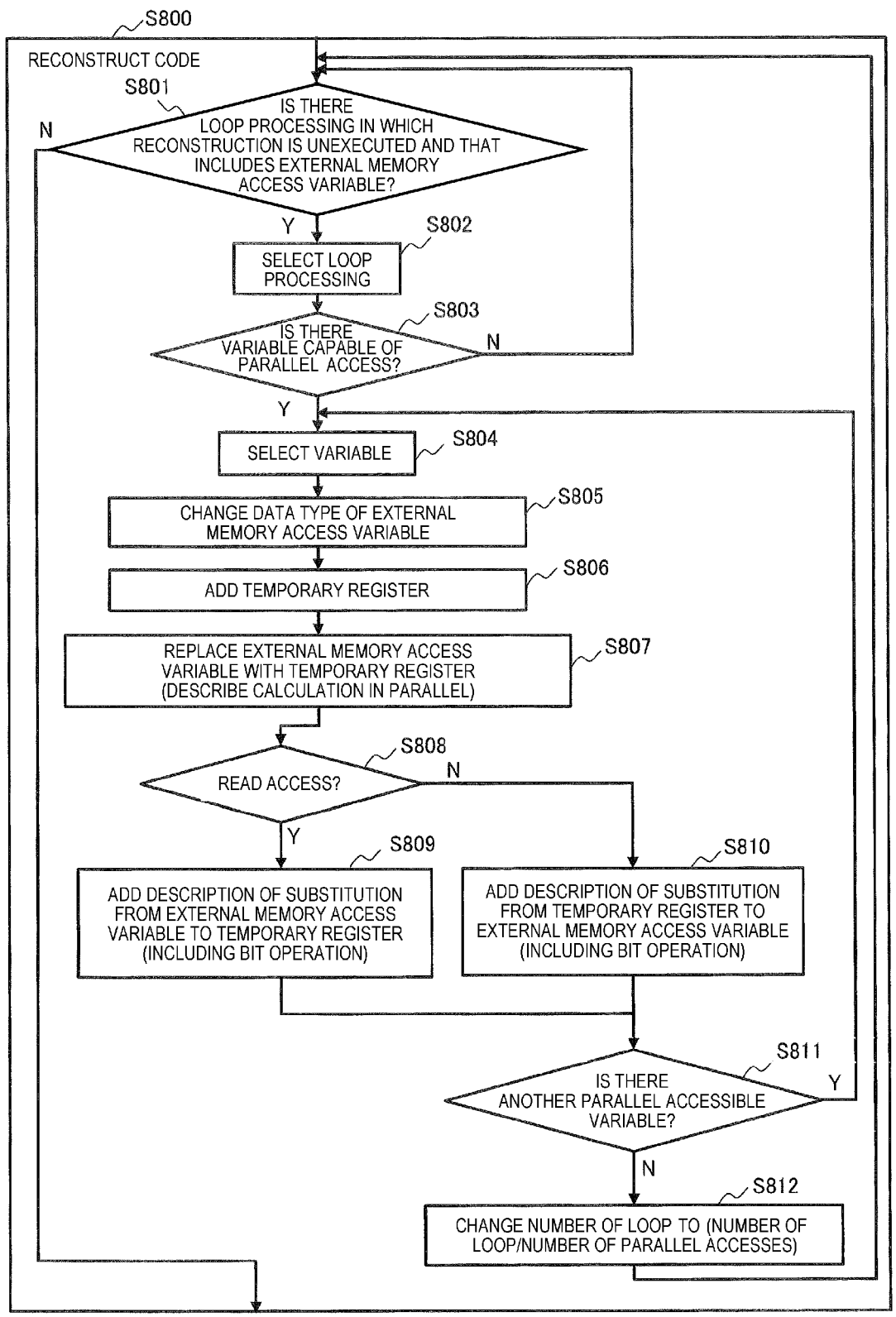

[FIG. 19]

```
                                                              ~213
#define HEIGHT 512
define WIDTH  512 typedef unsigned char u8;
typedef unsigned short u16;
                                               ~520
void func(u16 *img1, u16 *img2, u16 *out)
{
  int i, j;
  u16 img1_t, img2_t;
  u8  img1_t1, img1_t2;
  u8  img2_t1, img2_t2;     ~521
  u16 out_t;
  u8  out_t1, out_t2;

int LOOP_NUM1 = WIDTH/2;  ~522

LOOP1: for(i=0; i<HEIGHT; i++){
    LOOP11: for(j=0; j<LOOP_NUM1; j++){
                                             ~523
          img1_t = img1[i*LOOP_NUM1+j];
          img2_t = img2[i*LOOP_NUM1+j];
          img1_t1 = ((u8)img1_t>>8) & 0xff;
          img1_t2 = ((u8)img1_t)    & 0xff;
          img2_t1 = ((u8)img2_t>>8) & 0xff;
          img2_t2 = ((u8)img2_t)    & 0xff;
                                             ~524
          out_t1 = img1_t1>>1 + img2_t1>>1;
          out_t2 = img1_t2>>1 + img2_t2>>1;
                                             ~525
          out_t = ((u16)out_t1<<8) | ((u16)out_t2);
          out[i*LOOP_NUM1+(LOOP_NUM1)-j] = out_t;
    }
  } return;
}
```

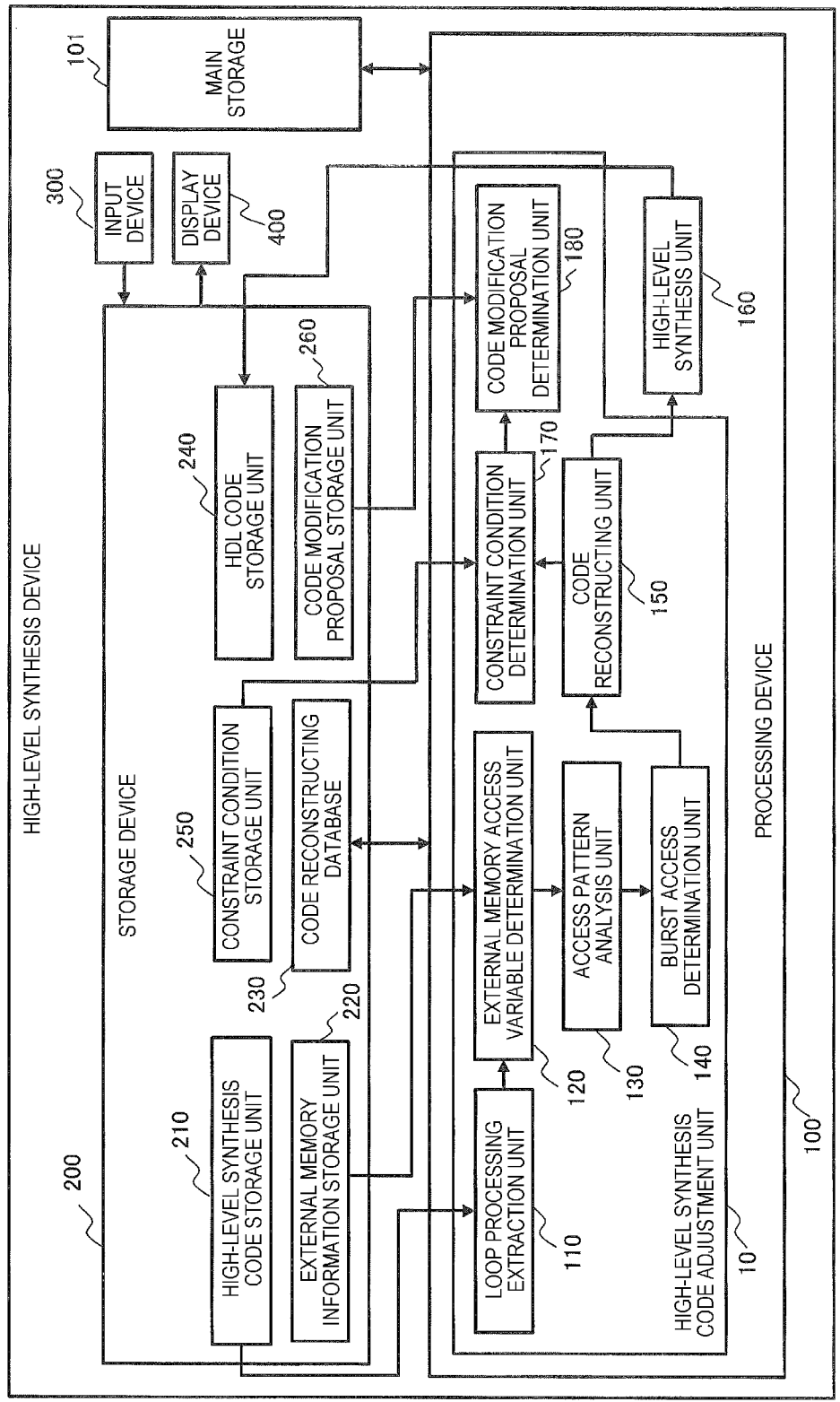
[FIG. 20]

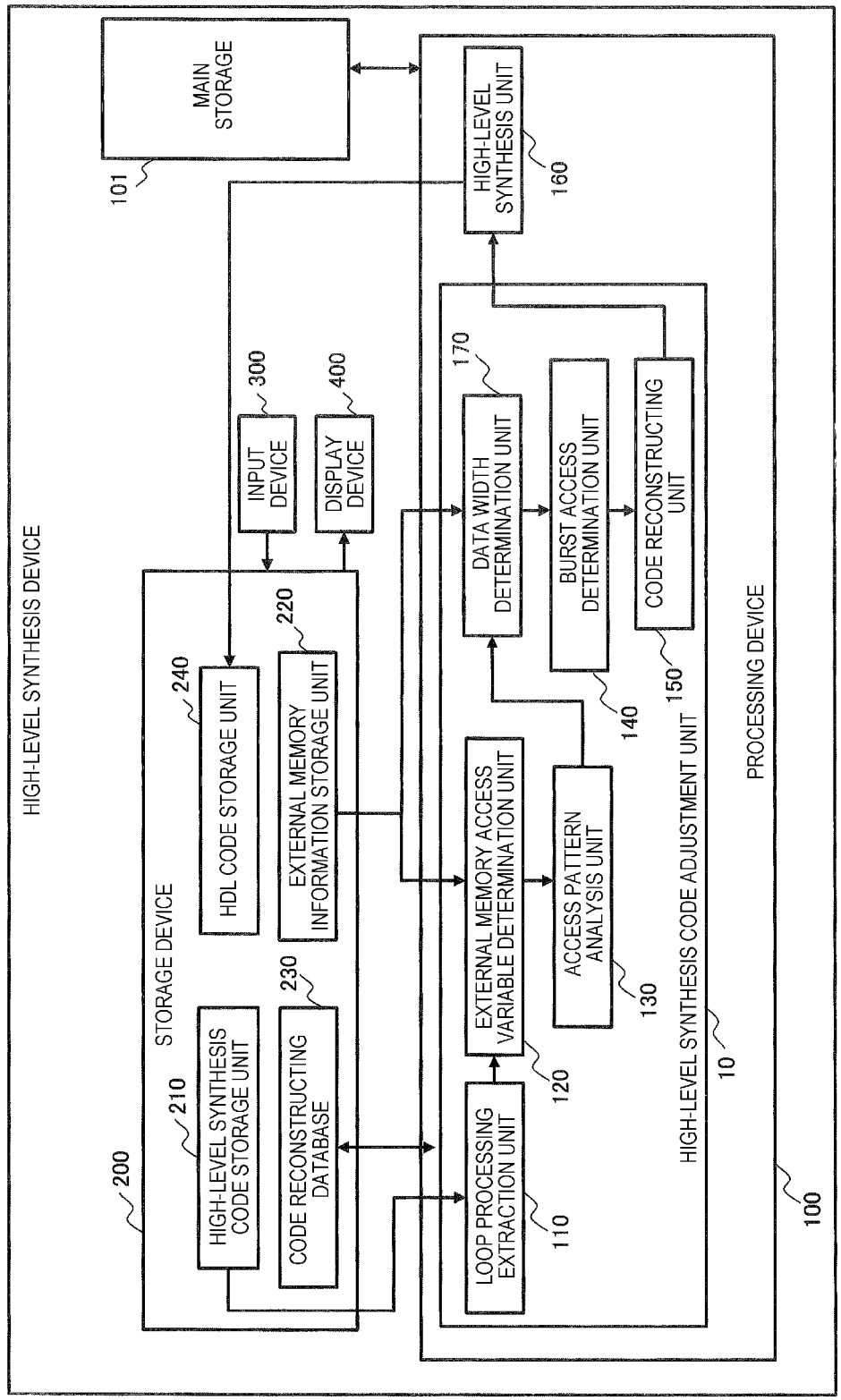
[FIG. 21]

HIGH-LEVEL SYNTHESIS DEVICE AND HIGH-LEVEL SYNTHESIS METHOD

CROSS-REFERENCE TO RELATED APPLICATIONS

The present application claims priority from Japanese Patent Application No. 2019-115205 filed on Jun. 21, 2019, contents of which are incorporated into the present application by reference.

TECHNICAL FIELD

The present invention relates to a high-level synthesis device that generates a description of a logic circuit using a programming language.

BACKGROUND ART

A hardware description language (HDL) is known as a language for describing a configuration of an integrated circuit (or logic circuit) such as a field programmable gate array (FPGA).

In a design of the integrated circuit using the hardware description language, the amount of source codes may be enormous. In recent years, a technique is known in which an algorithm or the like is designed using a high-level language such as C language to reduce the amount of source codes (high-level synthesis codes) and generate the hardware description language (for example, PTL 1).

PTL 1 discloses a technique of extracting a loop processing included in the high-level synthesis codes and changing the high-level synthesis codes to shorten processing time in a loop.

CITATION LIST

Patent Literature

PTL 1: WO 2017/154183

SUMMARY OF INVENTION

Technical Problem

In recent years, it is discussed that a large amount of data such as image processing and machine learning is processed with an integrated circuit such as FPGA. When a large amount of data such as images is handled, a configuration is desired in which a memory is added outside the FPGA, and input data is temporarily stored in an external memory and then processed by the integrated circuit.

However, in the related art above, there is a problem that an optimal hardware description language using the external memory cannot be automatically generated without considering a configuration in which the external memory is added to the integrated circuit.

Therefore, the invention is made in view of the above problem, and an object of the invention is to automatically generate an optimal hardware description language for hardware in which an external memory is added to an integrated circuit.

Solution to Problem

The invention relates to a high-level synthesis device including a processor and a memory. The high-level synthesis device generates a hardware description code describing a configuration of an integrated circuit connected to an external memory. The high-level synthesis device further includes a high-level synthesis code adjustment unit configured to receive a high-level synthesis code describing processing to be executed by the integrated circuit and an external memory access variable for data exchange with the external memory, analyze the high-level synthesis code, and reconstruct the high-level synthesis code based on an analysis result. The high-level synthesis code adjustment unit includes a burst access determination unit configured to analyze the external memory access variable in the high-level synthesis code and determines whether burst access is possible to the external memory, and a code reconstructing unit configured to reconstruct the external memory access variable that allows burst access by adding a code that executes the burst access to the high-level synthesis code.

Advantageous Effect

Therefore, by generating a high-level synthesis code for an integrated circuit that efficiently accesses an external memory, the invention can automatically generate an optimal hardware description language for hardware in which the external memory is added to the integrated circuit.

Details of at least one implementation of the subject disclosed in the present description are set forth in the accompanying drawings and the description below. Other features, aspects, and effects of the disclosed subject are elucidated in the disclosure, the drawings, and the claims below.

BRIEF DESCRIPTION OF DRAWINGS

FIG. 1 is a block diagram showing a first embodiment of the invention and showing an example of a high-level synthesis device.

FIG. 2 is a diagram showing the first embodiment of the invention and showing an example of processing performed by hardware to be designed.

FIG. 3 is a block diagram showing the first embodiment of the invention and showing an example of the hardware in which a generated hardware description language is applied to an integrated circuit.

FIG. 4 is a diagram showing the first embodiment of the invention and showing an example of processing in which the integrated circuit accesses an external memory.

FIG. 5 is a flowchart showing the first embodiment of the invention and showing an example of processing performed in a high-level synthesis device.

FIG. 6 is a flowchart showing the first embodiment of the invention and showing an example of burst access determination processing performed in the high-level synthesis device.

FIG. 7 is a flowchart showing the first embodiment of the invention and showing an example of code reconstructing processing performed in the high-level synthesis device.

FIG. 8 is a diagram showing the first embodiment of the invention and showing an example of a high-level synthesis code input to the high-level synthesis device.

FIG. 9 is a diagram showing the first embodiment of the invention and showing an example of code reconstructing information used by the high-level synthesis device.

FIG. 10A is a diagram showing the first embodiment of the invention and showing an example in which an access pattern of the external memory is an address increment.

FIG. 10B is a diagram showing the first embodiment of the invention and showing an example in which an access pattern of the external memory is an address decrement.

FIG. 10C is a diagram showing the first embodiment of the invention and showing an example in which an access pattern of the external memory is a random address.

FIG. 11 is a diagram showing the first embodiment of the invention and showing an example of a high-level synthesis code reconstructed by the high-level synthesis device.

FIG. 12 is a block diagram showing a related art and showing an example of a hardware configuration in the related art.

FIG. 13 is a diagram showing the related art and showing an example of accessing an external memory in the related art.

FIG. 14 is a block diagram showing a second embodiment of the invention and showing an example of a high-level synthesis device.

FIG. 15 is a flowchart showing the second embodiment of the invention and showing an example of processing performed in the high-level synthesis device.

FIG. 16 is a flowchart showing the second embodiment of the invention and showing an example of data width determination processing performed in the high-level synthesis device.

FIG. 17 is a diagram showing the second embodiment of the invention and showing an example of code reconstructing information for the high-level synthesis device.

FIG. 18 is a diagram showing the second embodiment of the invention and showing an example of code reconstructing processing of the high-level synthesis device.

FIG. 19 is a diagram showing the second embodiment of the invention and showing an example of a high-level synthesis code generated by the high-level synthesis device.

FIG. 20 is a block diagram showing a third embodiment of the invention and showing an example of the high-level synthesis device.

FIG. 21 is a block diagram showing a fourth embodiment of the invention and showing an example of a high-level synthesis device.

DESCRIPTION OF EMBODIMENTS

Embodiments of the invention will be described below with reference to the accompanying drawings.

First Embodiment

FIG. 1 is a block diagram showing the first embodiment of the invention and showing an example of a high-level synthesis device 1. The high-level synthesis device 1 receives a high-level synthesis code and external memory information, and generates a hardware description language (HDL) that describes a configuration of an integrated circuit (logic circuit) to which an external memory is connected.

The high-level synthesis device 1 is a computer including a processing device (processor) 100, main storage (memory) 101, a storage device (storage) 200, an input device 300, and a display device 400.

The storage device 200 stores a high-level synthesis code storage unit 210, an external memory information storage unit 220, a HDL code storage unit 240, and a code reconstructing database 230.

The high-level synthesis code storage unit 210 stores a definition (or algorithm) for processing performed by the integrated circuit described with a high-level language such as C language, C++ language, or Python. The external memory information storage unit 220 stores information on the external memory added to the integrated circuit.

The code reconstructing database 230 stores configuration information on the integrated circuit corresponding to an access pattern to the external memory. The HDL code storage unit 240 stores a hardware description language generated by the high-level synthesis device 1. Verilog or VHDL can be adopted as the hardware description language.

In the main storage 101, a high-level synthesis code adjustment unit 10 that tunes up the high-level synthesis code and a high-level synthesis unit 160 that generates a HDL code from a high-level synthesis code reconstructed by the high-level synthesis code adjustment unit 10 are stored as programs and executed by the processing device 100.

The high-level synthesis code adjustment unit 10 includes a loop processing extraction unit 110, an external memory access variable determination unit 120, an access pattern analysis unit 130, a burst access determination unit 140, and a code reconstructing unit 150.

The processing device 100 reads programs of the loop processing extraction unit 110, the external memory access variable determination unit 120, the access pattern analysis unit 130, the burst access determination unit 140, the code reconstructing unit 150, and the high-level synthesis unit 160 from the main storage 101 and makes these programs function.

The processing device 100 operates as a functional unit that provides a predetermined function by executing processing in accordance with the programs of the functional units. For example, the processing device 100 functions as the loop processing extraction unit 110 by executing processing according to a loop processing detection program. The same applies to other programs. Furthermore, the processing device 100 also operates as a functional unit that provides a function of each of a plurality of processing executed by the programs. A computer and a computer system are a device and a system including functional units.

The loop processing extraction unit 110 reads the high-level synthesis code from the high-level synthesis code storage unit 210 and detects the loop processing in the high-level synthesis code. The external memory access variable determination unit 120 reads the external memory information from the external memory information storage unit 220, and determines a variable for storing a value accessed from the external memory in the loop processing detected by the loop processing extraction unit 110.

The access pattern analysis unit 130 analyzes a pattern in which the integrated circuit accesses the external memory by the detected loop processing. The burst access determination unit 140 determines application of burst access in the loop processing based on an analysis result of the access pattern and the determined variable.

The code reconstructing unit 150 adds a burst access code to the loop processing of the high-level synthesis code based on a determination result of the burst access, replaces the variable with a buffer, adds parallel processing or pipeline processing, and outputs a reconstructed high-level synthesis code.

The high-level synthesis unit 160 reads the high-level synthesis code in which the code is reconstructed by the code reconstructing unit 150, and outputs and stores a hardware description language code (hereinafter, referred to as a HDL code) that determines a hardware configuration of the integrated circuit in the HDL code storage unit 240.

FIG. 2 is a diagram showing an example of processing performed by hardware. In the present embodiment, an image 1 and an image 2 are input to hardware 50 including the integrated circuit, and integration processing of synthesizing the image 1 and the image 2 and reversing processing of outputting an image reversed in a horizontal direction of the diagram are executed.

The high-level synthesis code is an input by which the high-level synthesis device 1 generates the HDL code for implementing the above-mentioned image processing with the integrated circuit of the hardware 50.

FIG. 3 is a block diagram showing the first embodiment of the invention and showing an example of the hardware 50 in which the hardware description language generated by the high-level synthesis device 1 is applied to the integrated circuit.

The hardware 50 shows an example in which an integrated circuit 60 and an external memory 70 are arranged on a substrate and are connected via a memory bus 80. As the integrated circuit 60, a field programmable gate array (FPGA), an application specific integrated circuit (ASIC) or a programmable logic device (PLD) can be adopted. As the external memory 70, a DRAM or the like capable of burst transfer can be adopted.

The inside of the integrated circuit 60 shows an example of a circuit constituted by the HDL code generated from the high-level synthesis code as in the processing shown in FIG. 4 (described later).

The integrated circuit 60 includes: parallel execution control 62 that executes processing in parallel; burst access control 63 that continuously reads the image 1 and the image 2 from the external memory 70; buffers (FIFO: first in first out) 64, 65 that temporarily store the read image 1 and image 2; integration and reversing processing 61 that reads the image 1 and the image 2 from the buffers 64 and 65, executes the integration processing and the reversing processing, and generates an output image; and a buffer (BRAM: block RAM) 65 that temporarily stores the output image. The output image stored in the buffer 65 is written to the external memory 70 at a predetermined timing by the burst access control 63.

FIG. 4 is a diagram showing an example of processing in which the integrated circuit 60 accesses the external memory 70. The integrated circuit 60 continuously reads 5 pixels of each of the image 1 and the image 2 from the external memory 70 (burst access), inputs the image 1 and the image 2 into a buffer constituted by the FIFO, and executes the integration and the reversing processing in parallel. The burst access data is not limited to five, and can be appropriately set according to a specification of the external memory 70 and the like.

The image 1 and the image 2 read by the burst access control 63 are read in parallel into the buffers 64, 65 constituted by the FIFO. The image 1 and the image 2 are acquired by the integration and reversing processing 61 in an order of being read into the buffers 64, 65, and the processing is executed to generate the output image.

By executing in parallel calculation processing and the burst access for continuously reading a plurality of pixels by applying the HDL code obtained from the high-level synthesis code of the present embodiment to the integrated circuit 60, processing capacity of the hardware 50 can be improved.

FIG. 5 is a flowchart showing an example of processing performed in the high-level synthesis device 1. The processing is started based on an instruction from a user of the high-level synthesis device 1 or the like. Before the start of the processing, the high-level synthesis code is stored in the high-level synthesis code storage unit 210, and variable information (external memory access variable information 221) storing data read by the integrated circuit 60 from the external memory 70 is stored in advance in the external memory information storage unit 220.

In the processing of the high-level synthesis device 1, the high-level synthesis code adjustment unit 10 receives the high-level synthesis code and the external memory access variable information 221, and performs the processing of reconstructing the high-level synthesis code based on the analysis result of the high-level synthesis code, and the processing of inputting the reconstructed high-level synthesis code to the high-level synthesis unit 160 to generate the HDL code.

First, the loop processing extraction unit 110 reads the high-level synthesis code from the high-level synthesis code storage unit 210, extracts the loop processing included in the high-level synthesis code, and stores a loop extraction result 231 in code reconstructing information 235 of the code reconstructing database 230 (S100).

Next, the external memory access variable determination unit 120 reads the external memory access variable information 221 from the external memory information storage unit 220, determines the variable used in the loop processing of the high-level synthesis code, and writes the variable to the code reconstructing information 235 of the code reconstructing database 230 as an external memory access variable determination result 232 (S200).

The external memory access variable information 221 is an array variable (FIGS. 10A to 10C) or the like for reading data from the external memory 70, and is preset information. Further, the external memory information storage unit 220 is preset based on design information of the external memory 70 mounted on the hardware 50 (on the substrate) and the integrated circuit 60 for accessing the external memory 70.

The access pattern analysis unit 130 analyzes the access pattern when reading the data from the external memory 70 in the loop processing of the high-level synthesis code, and writes the analysis result as an access pattern result 233 to the code reconstructing information 235 of the code reconstructing database 230 (S300). Regarding the access pattern result 233, for example, an address of the external memory 70 can be classified into increment or decrement, random, and the like.

Next, the burst access determination unit 140 determines whether the burst access is possible based on the access pattern result 233, and writes the burst access determination result 234 to the code reconstructing information 235 of the code reconstructing database 230 (S400).

The code reconstructing unit 150 reads the code reconstructing information 235 from the code reconstructing database 230, and adds the burst access code to the loop processing of the high-level synthesis code based on an access method and the access pattern if the burst access determination result 234 is burst accessible (S500). Further, the code reconstructing unit 150 changes a variable in a high-level synthesis code 211 into a buffer. Further, the code reconstructing unit 150 changes the processing in the high-level synthesis code 211 to the parallel processing or the pipeline processing depending on the type of a buffer used.

As described above, in step S500, the code reconstructing unit 150 performs addition of burst access processing, a change in the buffer, and code reconstruction (change) such as parallelization or pipelining. The code reconstructing unit 150 generates the high-level synthesis code in which the code is reconstructed by burst access or the like, and outputs the high-level synthesis code to the high-level synthesis unit 160.

The high-level synthesis unit 160 analyzes the high-level synthesis code output from the code reconstructing unit 150, outputs the HDL code, and stores the HDL code in the HDL code storage unit 240 (S600).

By the above processing, the extraction of the loop processing of the high-level synthesis code and the code reconstruction such as the addition of the burst access and the parallel processing is automatically executed, and the high-level synthesis unit 160 generates a HDL code 241 from the high-level synthesis code in which the code is reconstructed and stores the HDL code 241 in the HDL code storage unit 240.

The present embodiment shows an example in which the high-level synthesis code and the external memory access variable information 221 are stored in the storage device 200 in advance. Alternatively, at the start of the processing, the high-level synthesis code and the external memory access variable information 221 may be received from the outside or the input device 300.

FIG. 8 is a diagram showing an example of the high-level synthesis code 211 input to the high-level synthesis device 1. The high-level synthesis code 211 is a source code that describes the processing to be executed by the integrated circuit 60, and is stored in advance in the high-level synthesis code storage unit 210.

The high-level synthesis code 211 of the present embodiment shows processing in which while the integrated circuit 60 reads two images (img1 and img2 in the diagram) from the external memory 70, pixels with the same coordinates are added and reversed to generate an output image. The high-level synthesis code 211 includes two kinds of loop processing 500, 501.

A label "LOOP 1" is set in the loop processing 500, and a label "LOOP 11" is set in the loop processing 501.

The present embodiment shows an example in which the high-level synthesis code 211 is described in the C++ language. Alternatively, the invention is not limited to this, and the high-level synthesis code 211 can be described in C language, System C language, Matlab language, Python language, or the like.

FIG. 9 is a diagram showing an example of the code reconstructing information 235 used by the high-level synthesis device 1. The code reconstructing information 235 includes, in one entry, a loop #2351 that stores an identifier of the loop processing extracted from the high-level synthesis code 211, a loop name 2352 that stores a name of the loop processing, a variable #2353 that stores an identifier of the variable that stores data, an external memory access variable 2354 that stores a name of the variable that stores the data, an access method/access pattern 2355 that stores an access method and an access pattern to the external memory 70, burst access 2356 that stores whether the burst access is possible or not, a buffer 2357 that stores a format of the buffer, a buffer name 2358 that stores a name of the buffer, and a buffer size 2359 that stores capacity of the buffer.

The loop #2351 is the identifier given by the loop processing extraction unit 110, and is set for each loop extracted from the high-level synthesis code 211. The loop name 2352 stores a name (label) of the loop acquired from the high-level synthesis code 211 by the loop processing extraction unit 110.

The variable #2353 stores an identifier set by the external memory access variable determination unit 120. The external memory access variable 2354 stores a name of a variable acquired from the high-level synthesis code 211 by the external memory access variable determination unit 120.

The access method/access pattern 2355 stores the access method and the access pattern to the external memory 70 during the loop processing analyzed by the access pattern analysis unit 130. The burst access 2356 stores whether the burst access determined by the burst access determination unit 140 is possible or not. If the burst access is possible, "OK" is stored, and if the burst access is not possible, "NG" is stored.

The buffer 2357 stores the format of the buffer assigned to the external memory access variable 2354 determined by the burst access determination unit 140. As the format of the buffer, FIFO or double buffers can be set.

The buffer name 2358 stores the name of the buffer determined by the burst access determination unit 140 based on the high-level synthesis code 211. The buffer size 2359 stores the capacity determined by the burst access determination unit 140 based on the high-level synthesis code 211.

FIG. 10A is a diagram showing an example in which an access pattern of the external memory 70 is increment. The example shows a pattern in which an address (or index) i is incremented (added) to a data array 131 of a variable X to sequentially access adjacent addresses. An access direction 134 is a direction in which the address increases.

FIG. 10B is a diagram showing an example in which an access pattern of the external memory 70 is decrement. The example shows a pattern in which the address (or index) i is decremented (subtracted) to a data array 132 of a variable Y to sequentially access the adjacent addresses. The access direction 134 is a direction in which the address decreases.

FIG. 10C is a diagram showing an example in which an access pattern of the external memory 70 is a random address. The example shows that a data array 133 of a variable Z is accessed in the direction 134 in which the address (or index) i randomly increases or decreases.

The access pattern analysis unit 130 determines which of the above FIGS. 10A to 10C is the access pattern of the external memory 70 in the loop processing, and writes a determination result in the access method/access pattern 2355 of the code reconstructing information 235.

In the present embodiment, as shown in FIGS. 10A and 10B, the loop processing of sequentially accessing the data of adjacent addresses is changed to the burst access, and a plurality of data of the adjacent addresses are collectively accessed.

As shown in FIG. 4, the burst access of the present embodiment shows an example of reading five pieces of data having consecutive addresses with one burst read command. In the present embodiment, when image data is read from the external memory 70, the burst access is performed in the direction of incrementing the address in FIG. 10A. Further, in the image reversing processing, as shown in FIG. 10B, the access is performed in the direction of decrementing the address.

The access pattern analysis unit 130 can analyze the access pattern by parsing the high-level synthesis code 211 or compiling the code and then analyzing the address.

FIG. 6 is a flowchart showing an example of burst access determination processing performed in the high-level synthesis device 1. This processing is the processing of the burst access determination unit 140 shown in step S400 in FIG. 5.

The burst access determination unit 140 selects one external memory access variable 2354 from the code reconstructing information 235 and reads this entry (S401). The burst access determination unit 140 determines whether the access pattern of the access method/access pattern 2355 is the increment (S402). If the access pattern is the increment, the processing proceeds to step S404, otherwise, the processing proceeds to step S403.

In step S404, the burst access determination unit 140 determines that the variable is a variable capable of burst access, and stores "OK" in the burst access 2356 of the code reconstructing information 235. In step S405, the burst access determination unit 140 determines the format of the buffer to be FIFO and writes the format to the buffer 2357 of the code reconstructing information 235.

On the other hand, in step S403, the burst access determination unit 140 determines whether the access pattern is the decrement. If the access pattern is the decrement, the processing proceeds to step S405, otherwise, the processing proceeds to step S409.

In step S405, the burst access determination unit 140 determines that the variable is the variable capable of burst access, and stores "OK" in the burst access 2356 of the code reconstructing information 235. In step S407, the burst access determination unit 140 determines the format of the buffer to be the double buffers and writes the format to the buffer 2357 of the code reconstructing information 235.

Next, in step S408, the burst access determination unit 140 registers the number of the loop processing as the buffer size 2359 in the code reconstructing information 235.

In step S409, the burst access determination unit 140 determines whether the processing is completed for all variables of the code reconstructing information 235; and if not completed, the processing returns to step S401 to repeat the above processing, otherwise, the processing is terminated.

When the access pattern is the increment, the integrated circuit 60 uses the accessed data in sequential calculation, and thus it is possible to perform calculation in "parallel" while performing the burst access by setting FIFO (first in first out).

Conversely, in a case of the decrement, a data access direction needs to be reversed. Since the burst access is possible only in an increment direction, a calculation order is reversed in a FIFO order. Therefore, the burst access determination unit 140 sets a double buffer configuration. In the double buffers, two buffers including a data access buffer and a calculation buffer are set, and the burst access and calculation can be processed at the same time by switching the data access buffer and the calculation buffer alternately. That is, in the present embodiment, the processing can be sped up by pipelining the burst access and the calculation processing.

FIG. 7 is a flowchart showing an example of code reconstructing processing performed in the high-level synthesis device. This processing is the processing of the code reconstructing unit 150 shown in step S500 in FIG. 5.

In step S501, the code reconstructing unit 150 determines whether there is loop processing in which the code reconstructing processing is unexecuted and that includes the external memory access variable 2354; and if there is unexecuted loop processing, the processing proceeds to step S502, otherwise the processing is terminated.

In step S502, the code reconstructing unit 150 selects one unexecuted loop processing (loop name 2352) from the code reconstructing information 235.

In step S503, the code reconstructing unit 150 reads the burst access 2356 of the code reconstructing information 235 to determine whether the burst access is possible. If the burst access 2356 is "OK", the processing proceeds to step S504, otherwise, the processing proceeds to step S505.

In step S505, the code reconstructing unit 150 speeds up the loop processing and then returns to step S501 to repeat the above processing. As an example of speeding up the loop processing, processing such as pipelining or parallelizing the calculation in the loop processing may be performed.

In step S504, the code reconstructing unit 150 selects one external memory access variable 2354 from the selected loop processing. In step S506, the code reconstructing unit 150 determines whether the selected variable is read or write. The processing proceeds to step S507 if the selected variable is read, and proceeds to step S508 if the selected variable is write.

In step S507, the code reconstructing unit 150 adds a burst read code to the high-level synthesis code 211 outside the currently selected loop processing. On the other hand, in step S508, the code reconstructing unit 150 adds a burst write code to the high-level synthesis code 211 outside the currently selected loop processing.

Next, in step S509, the code reconstructing unit 150 reads the buffer name 2538 from the code reconstructing information 235 and adds the buffer name to the high-level synthesis code 211 as a buffer variable used for the burst access.

In step S510, the code reconstructing unit 150 replaces the external memory access variable 2354 of the high-level synthesis code 211 with the buffer variable (2358). In step S511, with reference to the buffer 2357 of the code reconstructing information 235, the code reconstructing unit 150 determines whether the buffer of the currently selected variable is FIFO. If the buffer is FIFO, the code reconstructing unit 150 proceeds to step S512, and if the buffer is not FIFO, the code reconstructing unit 150 proceeds to step S513.

In step S512, the code reconstructing unit 150 adds the parallel processing of the loop by the burst access to the high-level synthesis code 211. On the other hand, in step S513, the code reconstructing unit 150 adds the pipeline processing of the loop by the burst access to the high-level synthesis code 211.

The code reconstructing unit 150 returns to step S503 to process other variables in the same loop processing (2352). The code reconstructing unit 150 executes the above processing for all loop processing to be processed.

By the above processing, the input high-level synthesis code 211 in FIG. 8 is reconstructed as shown in FIG. 11. FIG. 11 is a diagram showing an example of the high-level synthesis code 212 reconstructed by the high-level synthesis device 1.

A code group of a reference numeral 510 in the drawing shows the buffer added in step S509 in FIG. 7. The code "# pragma" of a reference numeral 511 in the drawing is a control code for parallel processing or pipeline processing in step S512 or S513. The "# pragma" is a preprocessor specifier, and pipelining or parallelizing of the loop processing is performed based on the specifier. A notation differs depending on the type of the high-level synthesis unit 160.

A code group of a reference numeral 512 in the drawing shows a control code of the burst read added in step S507 in FIG. 7. Further, a code group of a reference numeral 513 in the drawing shows an example in which the variables according to steps S505 and S510 in FIG. 7 are replaced with buffers to speedup the processing. The code group of the reference numeral 513 in the drawing shows a control code of the burst write added in step S508 in FIG. 7.

FIG. 12 is a block diagram showing the related art and showing an example of a hardware configuration in the related art. According to the related art, an example is shown in which a HDL code is generated by accessing the external memory 70 from the integrated circuit 60 to perform the integration and the reversing processing and the HDL code is applied to the hardware 50.

Unlike the hardware 50 based on the HDL code of the present embodiment shown in FIG. 3, there is no burst access control or buffers.

FIG. 13 is a diagram showing the related art and showing an example of hardware processing in the related art. In the hardware 50 of FIG. 12, in the processing of reading the image 1 and the image 2 and generating an output image by adding the integration and reversing processing, the operation processing is performed by reading the image pixel by pixel.

However, in the hardware 50 to which the HDL code according to the present embodiment is applied, as shown in FIG. 4, since 5 pixels can be read continuously and the operation processing can be started during reading, the processing speed can be greatly improved.

As described above, according to the present embodiment, by generating the high-level synthesis code 212 that efficiently accesses the external memory 70, the optimal hardware description language for the hardware 50, in which the external memory 70 is added to the integrated circuit 60, can be automatically generated.

Second Embodiment

FIG. 14 is a block diagram showing the second embodiment of the invention and showing an example of a high-level synthesis device. In the second embodiment, a data width determination unit 170 is provided in the high-level synthesis code adjustment unit 10 in place of the burst access determination unit 140 in the first embodiment. As shown in FIG. 17, the code reconstructing information 235 replaces the burst access 2356 in the first embodiment with a parallel accessible pixel number 2360, and replaces the buffer 2357, the buffer name 2358, and the buffer size 2359 with a temporary register name 2361. Other configurations are the same as those in the first embodiment.

The data width determination unit 170 determines the number of data that can be accessed in parallel by comparing with the data type of an external memory access variable, so that the data width of the memory bus 80 that connects the external memory 70 and the integrated circuit 60 can be effectively used.

For example, when the data width of the memory bus 80 is 16 bits and one pixel is 8 bits, the processing speed can be increased as compared with the related art by accessing two pixels in parallel by the integrated circuit 60.

Since addresses of the data accessed by the integrated circuit 60 from the external memory 70 need to be continuous, the access pattern analysis unit 130 analyzes the access pattern in the same manner as in the first embodiment.

FIG. 15 is a flowchart showing an example of processing performed in the high-level synthesis device 1. Steps S100 to S300 are the same as in FIG. 5 of the first embodiment.

The data width determination unit 170 determines whether a plurality of pixels can be accessed in parallel based on the access pattern result in step S300; and if possible, the number of parallel accessible pixels is calculated and the data width determination result 236 is written to the parallel accessible pixel number 2360 of the code reconstructing information 235 of the code reconstructing database 230 (S400).

The code reconstructing unit 150 reads the code reconstructing information 235 from the code reconstructing database 230, and adds the parallel access code to the loop processing of the high-level synthesis code based on an access method and an access pattern since the parallel access is possible when the parallel accessible pixel number 2360 is 2 or more (S700). Further, the code reconstructing unit 150 changes a variable in the high-level synthesis code 211 into a temporary register.

The code reconstructing unit 150 performs the code reconstruction (change) such as addition of the parallel access and change to the temporary register (S800).

The code reconstructing unit 150 generates the high-level synthesis code in which the code is reconstructed by the parallel access or the like, and outputs the high-level synthesis code to the high-level synthesis unit 160.

The high-level synthesis unit 160 analyzes the high-level synthesis code output from the code reconstructing unit 150, outputs a HDL code, and stores the HDL code in the HDL code storage unit 240 (S600).

By the above processing, the extraction of the loop processing of the high-level synthesis code and the reconstruction such as the addition of the parallel access are automatically executed, and the high-level synthesis unit 160 generates the HDL code 241 from the high-level synthesis code in which the code is reconstructed.

FIG. 16 is a flowchart showing an example of data width determination processing performed in the high-level synthesis device 1. This processing is the processing of the data width determination unit 170 shown in step S700 in FIG. 15.

The data width determination unit 170 selects one external memory access variable 2354 from the code reconstructing information 235 and reads this entry (S701). The data width determination unit 170 determines whether the access pattern of the access method/access pattern 2355 is increment or decrement (S702). If the access pattern is the increment or the decrement, the processing proceeds to step S703, otherwise, the processing proceeds to step S705.

In step S703, the data width determination unit 170 determines that the variable is a variable that can be accessed in parallel, and calculates the parallel accessible pixel number based on the number of bits of one piece of data to be read and a data width of the memory bus 80. The data width determination unit 170 stores the number of pixels that can be simultaneously accessed in the parallel accessible pixel number 2360 of the code reconstructing information 235. In the present embodiment, the number of pixels is used. Alternatively, in a case other than image data, the number of data may be stored.

In step S704, the data width determination unit 170 registers a register that executes the parallel access in the temporary register name 2361 of the code reconstructing information 235. The temporary register name 2361 can be set according to the external memory access variable 2354 that performs input and output.

In step S705, the data width determination unit 170 determines whether the processing is completed for all variables of the code reconstructing information 235; and if not completed, the processing returns to step S701 to repeat the above processing, otherwise, the processing is terminated.

FIG. 17 is a diagram showing an example of the code reconstructing information for the high-level synthesis device. The code reconstructing information 235 replaces the burst access 2356 in the first embodiment with the parallel accessible pixel number 2360, and replaces the buffer 2357, the buffer name 2358, and the buffer size 2359 with the temporary register name 2361.

The example shows that the data type of the variable is 8 bits and the data width of the memory bus 80 is 16 bits, and the number of data that can be accessed at the same time is "2".

FIG. 18 is a diagram showing an example of code reconstructing processing of the high-level synthesis device 1. This processing is the processing of the code reconstructing unit 150 shown in step S800 in FIG. 15.

In step S801, the code reconstructing unit 150 determines whether there is loop processing in which the code reconstructing processing is unexecuted and that includes the external memory access variable 2354; and if there is unexecuted loop processing, the processing proceeds to step S802, otherwise the processing is terminated.

In step S802, the code reconstructing unit 150 selects one unexecuted loop processing (loop name 2352) from the code reconstructing information 235.

In step S803, the code reconstructing unit 150 reads the parallel accessible pixel number 2360 of the code reconstructing information 235 to determine whether the parallel access is possible. If the parallel accessible pixel number 2360 is 2 or more, the processing proceeds to step S804, otherwise, the processing returns to step S801 to perform the above processing for the next loop.

In step S804, the code reconstructing unit 150 selects one external memory access variable 2354 from the selected loop processing. In step S805, the code reconstructing unit 150 changes the data type (number of bits) of the selected variable according to the parallel accessible pixel number 2360.

In step S806, the code reconstructing unit 150 adds a temporary register variable corresponding to the currently selected variable to the high-level synthesis code 211.

Next, in step S807, the code reconstructing unit 150 replaces the external memory access variable in which the data type is changed with the above-mentioned temporary register.

In step S808, with reference to the access method/access pattern 2355 of the code reconstructing information 235, the code reconstructing unit 150 determines whether the access of the external memory access variable is read. The code reconstructing unit 150 proceeds to step S809 if the access is read access, and proceeds to step S810 if the access is write access.

In step S809, the code reconstructing unit 150 adds substitution processing from the external memory access variable 2354 to the temporary register to the high-level synthesis code 211. The code reconstructing unit 150 adds a predetermined bit operation such as shifting each pixel to access a plurality of pixels at the same time.

On the other hand, in step S810, the code reconstructing unit 150 adds substitution processing from the temporary register to the external memory access variable 2354 to the high-level synthesis code 211. The code reconstructing unit 150 adds a predetermined bit operation such as shifting each pixel to access a plurality of pixels at the same time.

Next, in step S811, the code reconstructing unit 150 determines whether there is an unprocessed variable that can be accessed in parallel in the current loop processing; and if there is an unprocessed variable, the processing returns to step S804 to repeat the above processing, and if there is no unprocessed variable, the processing proceeds to step S812.

In step S812, the code reconstructing unit 150 changes the number of loop processing of the high-level synthesis code 211 to the number of loop processing/the number of parallel accesses. The processing returns to step S801 to repeat the above-mentioned processing and the above processing is executed for all loop processing to be processed.

By the above processing, the input high-level synthesis code 211 in FIG. 8 is reconstructed as shown in FIG. 19. FIG. 19 is a diagram showing an example of the high-level synthesis code 213 reconstructed by the high-level synthesis device 1.

The high-level synthesis code 213 in the present embodiment is reconstructed into the processing of reading the data accessed by the integrated circuit 60 into the temporary register prepared according to a parallel number and performing calculation in parallel.

A code of a reference numeral 520 in the drawing shows the data type (number of bits) changed in step S805 of FIG. 18. A code group of a reference numeral 521 in the drawing shows the temporary register added in step S806 in FIG. 18.

A code of a reference numeral 522 in the drawing shows the number of loops changed in step S812 in FIG. 18. A code group of a reference numeral 523 in the drawing shows the substitution processing from the external memory access variable to the temporary register in step S809 in FIG. 18.

A code group of a reference numeral 524 in the drawing shows descriptions on the replacement of the external memory access variable with the temporary register and the parallelization of calculation in step S807 in FIG. 18. A code group of a reference numeral 525 in the drawing shows the substitution processing from the temporary register to the external memory access variable in step S810 of FIG. 18.

As described above, in the present embodiment, the high-level synthesis code adjustment unit 10 can shorten the processing time and improve the processing performance of the hardware 50 by increasing the number of parallel operations according to the data width of the memory bus 80 of the external memory 70.

Third Embodiment

FIG. 20 is a block diagram showing the third embodiment of the invention and showing an example of the high-level synthesis device 1. The present embodiment shows an example in which when a maximum buffer size is specified as a constraint condition of the integrated circuit 60, the number of loops is divided so that the reconstructed high-level synthesis code satisfies the constraint condition.

Regarding the high-level synthesis device 1 in the present embodiment, a constraint condition storage unit 250, a constraint condition determination unit 180, and a code modification proposal determination unit 190 are added to the configuration in the first embodiment, and other configurations are the same as in the first embodiment. The constraint condition determination unit 180 and the code modification proposal determination unit 190 are added to the high-level synthesis code adjustment unit 10.

The constraint condition storage unit 250 stores a maximum value of the buffer size that can be set by the integrated circuit 60. The constraint condition determination unit 180 reads the high-level synthesis code 212 output by the code reconstructing unit 150, and determines whether the described buffer size satisfies the condition of the constraint condition storage unit 250.

When the buffer size of the high-level synthesis code 212 exceeds the maximum value of the constraint condition storage unit 250, the constraint condition determination unit 180 notifies the code modification proposal determination unit 190. The code modification proposal determination unit 190 identifies the loop processing in which the buffer size exceeds the maximum value of the constraint condition storage unit 250, and proposes division of the loop processing and the like. The content of the proposal may be output to the display device 400.

In the present embodiment, when the constraint condition of the integrated circuit 60 is exceeded, it is possible to propose a modification part of the loop processing to a user of the high-level synthesis device 1.

Fourth Embodiment

FIG. 21 is a block diagram showing the fourth embodiment of the invention and showing an example of a high-level synthesis device. In the present embodiment, the burst access control in the first embodiment and the parallel access in the second embodiment are combined.

In the high-level synthesis code adjustment unit 10, the burst access determination unit 140 is arranged behind the data width determination unit 170. Other configurations are the same as in Embodiments 1 and 2.

According to the configuration of the present embodiment, the processing performance of the integrated circuit 60 can be further improved via the parallel access by the temporary register in addition to the burst access.

CONCLUSION

As described above, the high-level synthesis device in the above-mentioned first to fourth embodiments can be configured as follows.

(1) The high-level synthesis device (1) including: a processor (processing device 100); and a memory (main storage 101), wherein the high-level synthesis device (1) generates a hardware description code describing a configuration of an integrated circuit (60) connected to an external memory (70), the high-level synthesis device (1) further includes a high-level synthesis code adjustment unit (10) configured to receive a high-level synthesis code (211) describing processing to be executed by the integrated circuit (60) and an external memory access variable (221) for data exchange with the external memory (70), analyze the high-level synthesis code (211), and reconstruct the high-level synthesis code (211) based on an analysis result, and the high-level synthesis code adjustment unit (10) includes a burst access determination unit (140) configured to analyze the external memory access variable (221) in the high-level synthesis code (211) and determine whether burst access is possible to the external memory (70), and a code reconstructing unit (150) configured to reconstruct the external memory access variable (221) that allows burst access by adding a code configured to execute the burst access to the high-level synthesis code (211).

According to the above configuration, when the burst access is possible with the external memory access variable of the high-level synthesis code 211, the high-level synthesis device can reconstruct the high-level synthesis code 212 by adding a code that executes the burst access to the high-level synthesis code 211. By collectively accessing data by the burst access, the processing performed by the integrated circuit 60 can be sped up.

(2) The high-level synthesis device (1) described in (1) above further includes a high-level synthesis unit (160) configured to input the high-level synthesis code (212) reconstructed by the code reconstructing unit (150) to generate the hardware description code.

According to the above configuration, the high-level synthesis unit 160 can generate the HDL code of the integrated circuit 60 by inputting the high-level synthesis code 212 to which the burst access code is added. By applying the HDL code to the integrated circuit 60, the integrated circuit 60 can speed up the processing by collectively accessing the data by the burst access.

(3) In the high-level synthesis device (1) described in (1) above, the high-level synthesis code adjustment unit (10) further includes a loop processing extraction unit (110) configured to extract loop processing in the high-level synthesis code (211) and an external memory access variable determination unit (120) configured to determine the external memory access variable (221) described in the loop processing.

According to the above configuration, the external memory access variable described in the loop processing of the high-level synthesis code 211 is targeted for the burst access, so that the high-level synthesis code 212 can be reconstructed by adding the burst access code.

(4) In the high-level synthesis device (1) described in (3) above, the high-level synthesis code adjustment unit (10) further includes an access pattern analysis unit (130) configured to analyze an access pattern to the external memory (70) in the external memory access variable (221).

According to the above configuration, the burst access pattern can be determined by targeting the external memory access variable described in the loop processing of the high-level synthesis code 211 for the burst access.

(5) In the high-level synthesis device (1) described in (4) above, the burst access determination unit (140) determines a preset buffer according to the access pattern, and the code reconstructing unit (150) adds a code for pipeline processing or parallel processing according to a type of the determined buffer.

According to the above configuration, the code reconstructing unit 150 performs the addition of burst access processing, the change in the buffer, the code reconstruction (change) such as parallelization or pipelining. The code reconstructing unit 150 generates the high-level synthesis code 212 in which the code is reconstructed by the burst access or the like, and outputs the high-level synthesis code to the high-level synthesis unit 160. By generating the HDL code from the high-level synthesis code 212, the integrated circuit 60 can efficiently access the external memory 70 and execute the calculation processing at high speed.

The invention is not limited to the above embodiments, and includes various modifications. For example, the above embodiments are described in detail for easy understanding of the invention, and the invention is not necessarily limited to those including all of the configurations described above. Further, a part of a configuration of one embodiment can be replaced with a configuration of another embodiment, and a configuration of one embodiment can be added to a configuration of another embodiment. Further, with respect to a part of a configuration of each embodiment, addition, deletion, or replacement of another configuration can be applied alone or in combination.

Further, a part or all of the configurations, functions, processing units, processing methods or the like described above may be implemented by hardware such as through design using an integrated circuit. Further, the above configurations, functions, or the like may be implemented by software by means of a processor interpreting and executing a program for implementing respective functions. Information such as a program, a table, and a file for implementing each of the functions can be stored in a recording device such as a memory, a hard disk, or a solid state drive (SSD), or in a recording medium such as an IC card, a SD card, or a DVD.

Further, control lines or information lines indicate what is considered necessary for description, and not all the control lines or information lines are necessarily shown in a product. In practice, it may be considered that almost all configurations are connected to each other.

Supplement

The following matters are typical viewpoints of the invention other than those described in the scope of claims.
<13>
A high-level synthesis method for generating a hardware description code describing a configuration of an integrated circuit connected to an external memory by a high-level synthesis device including a processor and a memory, the method including: an input step of receiving a high-level synthesis code describing processing to be executed by the integrated circuit and an external memory access variable for data exchange with the external memory by the high-level synthesis device; a data width determination step of calculating the number of data that is accessible in parallel from a data type of the external memory access variable in the high-level synthesis code and a data width of the external memory by the high-level synthesis device; and a code reconstructing step of reconstructing the external memory access variable that allows parallel access by adding a code configured to execute predetermined processing in parallel to the high-level synthesis code by the high-level synthesis device.
<14>
The high-level synthesis method described in <13> above further includes a high-level synthesis step of inputting the high-level synthesis code reconstructed by the high-level synthesis device to generate the hardware description code.
<15>
A storage medium that stores a program for generating a hardware description code describing a configuration of an integrated circuit connected to an external memory by a computer including a processor, a memory, and a storage device, the storage medium being a non-transitory computer-readable storage medium that stores a program for causing the computer to execute an input step of receiving a high-level synthesis code describing processing to be executed by the integrated circuit and an external memory access variable for data exchange with the external memory, a burst access determination step of analyzing the external memory access variable in the high-level synthesis code and determining whether burst access is possible to the external memory, and a code reconstructing step of reconstructing the external memory access variable that allows burst access by adding a code configured to execute the burst access to the high-level synthesis code.

The invention claimed is:

1. A high-level synthesis device comprising:
a processor; and
a memory, wherein
the high-level synthesis device generates a hardware description code describing a configuration of an integrated circuit connected to an external memory,
the high-level synthesis device further comprises:
a high-level synthesis code adjustment unit configured to receive a high-level synthesis code describing processing to be executed by the integrated circuit and an external memory access variable for data exchange with the external memory, analyze the high-level synthesis code, and reconstruct the high-level synthesis code based on an analysis result, and
the high-level synthesis code adjustment unit includes:
a burst access determination unit configured to analyze the external memory access variable in the high-level synthesis code and determine whether burst access is possible to the external memory; and
a code reconstructing unit configured to reconstruct the external memory access variable that allows burst access by adding a code configured to execute the burst access to the high-level synthesis code.

2. The high-level synthesis device according to claim 1, further comprising:
a high-level synthesis unit configured to input the high-level synthesis code reconstructed by the code reconstructing unit to generate the hardware description code.

3. The high-level synthesis device according to claim 1, wherein
the high-level synthesis code adjustment unit further includes:
a loop processing extraction unit configured to extract loop processing in the high-level synthesis code; and
an external memory access variable determination unit configured to determine the external memory access variable described in the loop processing.

4. The high-level synthesis device according to claim 3, wherein
the high-level synthesis code adjustment unit further includes:
an access pattern analysis unit configured to analyze an access pattern to the external memory in the external memory access variable.

5. The high-level synthesis device according to claim 4, wherein
the burst access determination unit determines a preset buffer according to the access pattern,
the code reconstructing unit adds a code for pipeline processing or parallel processing according to a type of the determined buffer.

6. A high-level synthesis device comprising:
a processor; and
a memory, wherein
the high-level synthesis device generates a hardware description code describing a configuration of an integrated circuit connected to an external memory,
the high-level synthesis device further comprises:
a high-level synthesis code adjustment unit configured to receive a high-level synthesis code describing processing to be executed by the integrated circuit and an external memory access variable for data exchange with the external memory, analyze the high-level synthesis code, and reconstruct the high-level synthesis code based on an analysis result, and
the high-level synthesis code adjustment unit includes:
a data width determination unit configured to calculate the number of data that is accessible in parallel from a data type of the external memory access variable in the high-level synthesis code and a data width of the external memory; and
a code reconstructing unit configured to reconstruct the external memory access variable that allows parallel access by adding a code configured to execute predetermined processing in parallel to the high-level synthesis code.

7. The high-level synthesis device according to claim 6, further comprising:

a high-level synthesis unit configured to input the high-level synthesis code reconstructed by the code reconstructing unit to generate the hardware description code.

8. A high-level synthesis method for generating a hardware description code describing a configuration of an integrated circuit connected to an external memory by a high-level synthesis device including a processor and a memory, the method comprising:
- an input step of receiving a high-level synthesis code describing processing to be executed by the integrated circuit and an external memory access variable for data exchange with the external memory by the high-level synthesis device;
- a burst access determination step of analyzing the external memory access variable in the high-level synthesis code and determining whether burst access is possible to the external memory by the high-level synthesis device; and
- a code reconstructing step of reconstructing the external memory access variable that allows burst access by adding a code configured to execute the burst access to the high-level synthesis code by the high-level synthesis device.

9. The high-level synthesis method according to claim 8, further comprising:
a high-level synthesis step of inputting the high-level synthesis code reconstructed by the high-level synthesis device to generate the hardware description code.

10. The high-level synthesis method according to claim 8, further comprising:
- a loop processing extraction step of extracting loop processing in the high-level synthesis code by the high-level synthesis device; and
- an external memory access variable determination step of determining the external memory access variable described in the loop processing by the high-level synthesis device.

11. The high-level synthesis method according to claim 10, further comprising:
an access pattern analysis step of analyzing an access pattern to the external memory in the external memory access variable by the high-level synthesis device.

12. The high-level synthesis method according to claim 11, wherein
- in the burst access determination step, a preset buffer is determined according to the access pattern, and
- in the code reconstructing step, a code for pipeline processing or parallel processing is added according to a type of the determined buffer.

* * * * *